United States Patent
Kitabatake et al.

(10) Patent No.: US 7,436,031 B2
(45) Date of Patent: Oct. 14, 2008

(54) DEVICE FOR IMPLEMENTING AN INVERTER HAVING A REDUCED SIZE

(75) Inventors: Makoto Kitabatake, Nara (JP); Osamu Kusumoto, Nara (JP); Masao Uchida, Osaka (JP); Kunimasa Takahashi, Osaka (JP); Kenya Yamashita, Osaka (JP); Ryoko Miyanaga, Nara (JP); Koichi Hashimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 81 days.

(21) Appl. No.: 10/588,960

(22) PCT Filed: Aug. 26, 2005

(86) PCT No.: PCT/JP2005/015575

§ 371 (c)(1),
(2), (4) Date: Aug. 10, 2006

(87) PCT Pub. No.: WO2006/022387

PCT Pub. Date: Mar. 2, 2006

(65) Prior Publication Data

US 2007/0158778 A1  Jul. 12, 2007

(30) Foreign Application Priority Data

Aug. 26, 2004  (JP)  ............... 2004-246412

(51) Int. Cl.
*H01L 29/76* (2006.01)
*H01L 29/94* (2006.01)
*H01L 31/00* (2006.01)
(52) U.S. Cl. ............... 257/379; 257/368; 257/E27.016
(58) Field of Classification Search ........... 257/368, 257/379, 380, E27.016
See application file for complete search history.

(56) References Cited

U.S. PATENT DOCUMENTS 5,351,182 A  9/1994  Miyazaki et al.

(Continued)

FOREIGN PATENT DOCUMENTS

JP  08-335863  12/1996

(Continued)

OTHER PUBLICATIONS

European Search Report, issued in Corresponding European Patent Application No. 05775056.4-1242, dated on Jul. 24, 2007.

(Continued)

*Primary Examiner*—Ngan Ngo
(74) *Attorney, Agent, or Firm*—McDermott Will & Emery LLP

(57) ABSTRACT

A semiconductor device according to this invention includes: two level shift switches (28A and 28B) each having first and second electrodes, a control electrode, a signal output electrode, and a first semiconductor region forming a transistor device section (28a,28b) which intervenes between the first electrode and the signal output electrode and is brought into or out of conduction according to a signal inputted to the control electrode and a resistor device section (Ra,Rb) which intervenes between the signal output electrode and the second electrode, the first semiconductor region comprising a wide bandgap semiconductor; and a diode (23) having a cathode-side electrode, an anode-side electrode, and a second semiconductor region comprising a wide bandgap semiconductor.

14 Claims, 10 Drawing Sheets

U.S. PATENT DOCUMENTS

| | | |
|---|---|---|
| 5,502,412 A | 3/1996 | Choi et al. |
| 2002/0131287 A1 | 9/2002 | Majumdar et al. |
| 2003/0006415 A1 | 1/2003 | Yokogawa et al. |
| 2003/0048116 A1 | 3/2003 | Suetsugu |
| 2006/0033480 A1* | 2/2006 | Soldano .................. 323/225 |

FOREIGN PATENT DOCUMENTS

| | | |
|---|---|---|
| JP | 2002-093920 | 3/2002 |
| JP | 2002-203966 | 7/2002 |
| JP | 2003-079131 | 3/2003 |
| JP | 2003-228320 | 8/2003 |
| WO | WO 97/01209 | 1/1997 |

OTHER PUBLICATIONS

European Office Action, issued in Corresponding European Patent Application No. 05775056.4-1242, dated on Oct. 12, 2007.

* cited by examiner

DEVICE FOR IMPLEMENTING AN INVERTER HAVING A REDUCED SIZE

RELATED APPLICATION

This application is a national phase of PCT/JP2005/015575 filed on Aug. 26, 2005, which claims priority from Japanese Application No. 2004-246412 filed on Aug. 26, 2004, the disclosures of which Applications are incorporated by reference herein. The benefit of the filing and priority dates of the International and Japanese Applications is respectfully requested.

TECHNICAL FIELD

The present invention relates to a semiconductor device constructed by mainly using a wide bandgap semiconductor such as silicon carbide (SiC), GaN, diamond or the like, as well as a module using the same.

BACKGROUND ART

FIG. 10 is a conceptual view illustrating an inverter for motor control as one example of a module using a conventional semiconductor device. In using a semiconductor device (power device) adapted to control a motor 1 as an IC or a module as shown in FIG. 10, it has been technically difficult to integrate a control circuit 3 comprising, for example, a low-voltage control/logic semiconductor circuit to be driven by a low-voltage power supply 2 and power switching devices 5H and 5L adapted to handle a high-voltage large current supplied from a high-voltage power supply 4 into one chip or to pack these circuit and devices into the same package. For this reason, small number of such ICs or modules that can be widely used for industrial purposes has been reported. Power ICs and modules fabricated by the current Si semiconductor technology are formed through a quite complicated process fully utilizing an isolation technique for electrically isolating low-voltage devices from high-voltage devices.

In a semiconductor device called "intelligent power module" (IPM) (see non-patent document 1 for example), in particular, a gate drive circuit 6, which is associated with the high-side power switching device 5H of the power switching devices (IGBTs, MOSFETs or the like) included in the inverter adapted to control the motor 1 or the like, needs to operate in a high-potential condition floating relative to the ground potential and, hence, a high-potential floating power supply 7 is also needed. This is because the potential of the connecting portion between the high-side power switching device 5H and the low-side power switching device 5L which are connected to the load fluctuates constantly depending upon the conditions of the power switching devices and, hence, the power switching device 5H, which is on the high side relative to such a fluctuating potential, needs to be applied with a gate potential for switching control. To this end, a level shift technique is needed such as to allow signals relative to the ground potential used as a reference that are fed from the control circuit 3 to be transferred to the gate drive circuit 6 in a high-potential floating condition.

Patent document 1: Japanese Patent Laid-Open Publication No. HEI 10-027853
Patent document 2: Japanese Patent Laid-Open Publication No. HEI 06-260601
Patent document 3: Japanese Patent Laid-Open Publication No. HEI 08-335863
Patent document 4: Japanese Patent Laid-Open Publication No. 2000-286391

Non-patent document 1: "POWER DEVICE•POWER IC HANDBOOK", CORONA PUBLISHING CO., LTD., edited by high-performance and high-capability power device and power IC research expert committee of The institute of Electrical Engineers of Japan, P. 218

DISCLOSURE OF INVENTION

Problem to be Solved by Invention

A representative level shift circuit used in a conventional inverter for driving a Si power device has a configuration of the type using a photocoupler as shown in FIG. 10. In this type of level shift circuit, a LED (light-emitting diode) 9 emits light in response to a signal from the control circuit 3, which signal is relative to the ground potential serving as a reference, and a photodiode 8 is illuminated with light thus emitted to produce an optical potential, which in turn is used as a signal for driving the gate of the high-side power switching device 5H. By thus using the photocoupler, it becomes possible to transmit the signal to the gate drive circuit 6 in a high-potential floating condition. One photocoupler is needed for one high-side power switching device. Accordingly, for example the three-phase output drive circuit shown in FIG. 10 requires at least three photocouplers and three power supplys for high-side gate drive.

On the other hand, a gate drive circuit 10 associated with the low-side power switching devices 5L is a low-voltage circuit, which does not require three independent floating power supplys unlike the high-side power switching device. The drive circuit 10 supplies voltage outputted from one low-side power supply 11 to the three low-side power switching devices 5L in inverter control.

The aforementioned type of configuration has a drawback that a module incorporating this configuration becomes large-sized because the module requires a certain degree of capacity for packaging therein the three high-side power switching devices 5H, gate drive circuits 6, floating power supplys 7, and level shift circuits (photodiodes 8 and LEDs 9). Usually, a conventional Si power device, when provided with a 10-ampere (A) switching device, requires a size of 5×5 mm$^2$, and the gate drive circuit 6 and photodiode 8 formed on a separate chip are mounted in this area. In view of heat generation from the power switching device 5H, other circuit elements are mounted in an independent heat dissipation mechanism which is insusceptible to heat generated from the power switching device 5H. Further, the LED 9 for illuminating the photodiode 8 with light is also separately mounted, and the floating power supply 7 (a bootstrap floating power supply for example) comprising a high withstand voltage diode, a resistor and a capacitor is mounted as well. Since three sets of these device components are mounted on the high side with heat dissipation taken into consideration, a considerable capacity is needed for the device components to be packaged. Thus, a 10-ampere (A) order inverter module needs to have a size of not less than 5×5 cm$^2$.

Level shift circuits of other types than the aforementioned type using a photocoupler include a level shift circuit using a gate drive IC. This gate drive IC is a high withstand voltage integrated circuit fabricated by utilizing the junction isolation technology to integrate a high withstand voltage level shifter and a flip-flop circuit together, which are formed by using Si. The principle underlying the operation of the gate drive IC is as follows. A gate drive signal inputted on the high side is separated into a leading edge pulse and a falling edge pulse by a pulse generator. These two pulse signals thus separated are inputted to the flip-flop circuit in a floating condition via the level shifter and then the high-side gate drive circuit is driven by the output of the flip-flop. In this case, the power supply used is a bootstrap power supply for example.

This conventional art needs to form the high withstand voltage level shifter, the flip-flop circuit in a floating condition and the like each comprising a Si device fabricated to ensure that its withstand voltage is high by the junction isolation technique and a like technique. Such a device needs to have a special device structure with device isolation taken into consideration even when the voltage used is in the range from several hundred V to about 1.2 kV. Also, the fabrication method used is complicated. Further, the device needs to be a lateral device of which all the electrodes lie on the surface thereof. Thus, the device is large-sized (see patent documents 1, 2, 3 and 4 for example).

The aforementioned level shifter comprises a level shift switch 28a to which a resistor Ra is connected and a level shift switch 28b to which a resistor Rb is connected as shown in FIG. 1 for example. In this case, the resistors Ra and Rb need to be connected to the level shift switches 28a and 28b, respectively. Accordingly, wires and a wiring process as well as the external resistors Ra and Rb are required, which impedes the downsizing of the level shifter.

The present invention has been made to solve the aforementioned problems. Accordingly, it is an object of the present invention to provide a semiconductor device which is useful in downsizing an inverter device, a level shifter for use in such a semiconductor device, and a module using such a semiconductor device. Particularly, a vertical-type semiconductor device having electrodes formed on the obverse and reverse sides thereof according to the present invention can be packaged together with a power chip or the like in a stacked fashion, thereby realizing a downsized inverter.

Means for Solving Problem

In order to attain the foregoing object, the present invention provides a semiconductor device including: two level shift switches each having first and second electrodes, a control electrode, a signal output electrode, and a first semiconductor region forming a transistor device section which intervenes between said first electrode and said signal output electrode and is brought into or out of conduction according to a signal inputted to said control electrode and a resistor device section which intervenes between said signal output electrode and said second electrode, said first semiconductor region comprising a wide bandgap semiconductor; and a diode having a cathode-side electrode, an anode-side electrode, and a second semiconductor region comprising a wide bandgap semiconductor.

The level shift switches and diode thus formed using the wide bandgap semiconductor have high withstand voltage characteristics, can be downsized, and are operable under high-temperature conditions. It is therefore possible to downsize the semiconductor device as well as a module using the same and an inverter device using such a module or a like device. Each of the level shift switches of the present invention has the resistor device section formed internally of the chip which corresponds to the resistor that has conventionally been connected externally of the chip. For this reason, such an external resistor and wiring thereof can be eliminated, which can contribute to the downsizing of the device and simplification of the wiring process.

In the semiconductor device of the present invention, preferably, said first semiconductor region of each of said level shift switches has: a wide bandgap semiconductor substrate of a first conductivity type; a drift layer of the first conductivity type formed on said wide bandgap semiconductor substrate; a well region of a second conductivity type formed in a surface region of said drift layer exclusive of a part of the surface region; a source region of the first conductivity type formed in a predetermined region of a surface of said well region; and a RESURF region spaced apart from said source region and formed to extend over said well region and said part of the surface region of said drift layer, said RESURF region being of the first conductivity type or of a stacked structure comprising a first conductivity type semiconductor and an intrinsic semiconductor, wherein said first electrode is formed on said source region; said control electrode is formed over a portion of said well region lying intermediate said source region and said RESURF region with a gate insulator intervening therebetween; said signal output electrode is formed on said RESURF region; and said second electrode is formed on a reverse side of said wide bandgap semiconductor substrate, and wherein said well region, said source region and said RESURF region form said transistor device section; and said RESURF region, said drift layer including said part of the surface region and said wide bandgap semiconductor substrate form said resistor device section. The RESURF region is spaced apart from the source region by a distance substantially equal to the length of the channel portion a MOSFET forming each level shift switch, for example, about 1 to about 10 μm.

In this case, a channel region comprising a wide bandgap semiconductor which is of the first conductivity type or of a stacked structure comprising a first conductivity type semiconductor and an intrinsic semiconductor may be formed immediately under said gate insulator to interconnect said source region of the first conductivity type and said RESURF region of the first conductivity type or of said stacked structure comprising a first conductivity type semiconductor and an intrinsic semiconductor. This arrangement allows the threshold voltage of the transistor device section to be adjusted.

In the semiconductor device of the present invention, preferably, said second electrodes of respective of said two level shift switches and said cathode-side electrode of said diode are integrated into a common electrode. The provision of such a common electrode makes it possible to eliminate an electrode interconnection process.

In the semiconductor device of the present invention, preferably, said first semiconductor region of each of said two level shift switches and said second semiconductor region of said diode are formed of a same wide bandgap semiconductor substrate and a same wide bandgap semiconductor region formed thereon. This arrangement allows the two level shift switches and the diode to be formed by one chip.

In this case, preferably, said wide bandgap semiconductor substrate forming said first semiconductor region of each of said level shift switches is of a first conductivity type; said wide bandgap semiconductor region forming said first semiconductor region of each of the level shift switches has: a drift layer of the first conductivity type formed on said wide bandgap semiconductor substrate; a well region of a second conductivity type formed in a surface region of said drift layer exclusive of a part of the surface region; a source region of the first conductivity type formed in a predetermined region of a surface of said well region; and a RESURF region spaced apart from said source region and formed to extend over said well region and said part of the surface region of said drift layer, said RESURF region being of the first conductivity type or of a stacked structure comprising a first conductivity type semiconductor and an intrinsic semiconductor, wherein said first electrode is formed on said source region; said control electrode is formed over a portion of said well region lying intermediate said source region and said RESURF region with a gate insulator intervening therebetween; said signal output electrode is formed on said RESURF region; and said second electrode is formed on a reverse side of said wide bandgap semiconductor substrate, and wherein said well region, said source region and said RESURF region form said transistor device section; and said RESURF region, said drift layer including said part of the surface region and said wide bandgap semiconductor substrate form said resistor device section. The RESURF region is spaced apart from the source region by a distance substantially equal to the length of a channel portion of a MOSFET forming each level shift switch, for example, about 1 to about 10 μm.

In this case, a channel region comprising a wide bandgap semiconductor which is of the first conductivity type or of a stacked structure comprising a first conductivity type semiconductor and an intrinsic semiconductor may be formed immediately under said gate insulator to interconnect said source region of the first conductivity type and said RESURF region of the first conductivity type or of said stacked structure comprising a first conductivity type semiconductor and an intrinsic semiconductor. This arrangement allows the threshold voltage of the transistor device section to be adjusted.

Preferably, said second electrodes of respective of said two level shift switches and said cathode-side electrode of said diode are integrated into a common electrode located on a reverse side of said wide bandgap semiconductor substrate, while said first electrode and said signal output electrode of each of said two level shift switches and said anode-side electrode of said diode located on an obverse side of said wide bandgap semiconductor substrate. The provision of such a common electrode makes it possible to eliminate an electrode interconnection process.

Preferably, said two level shift switches and said diode are each device-isolated by a mesa structure or a p-n junction on the obverse side of said wide bandgap semiconductor substrate.

In the semiconductor device of the present invention described above, preferably, the diode is a Schottky diode having a Schottky electrode as the anode-side electrode. Use of such a Schottky diode enables a drop in forward voltage to decrease thereby realizing a high-speed operation.

In the semiconductor device of the present invention described above, preferably, the wide bandgap semiconductor is silicon carbide.

The present invention also provide a module for use in an inverter device including at least one combination of: an inverter main circuit section having: a high-side power switching device which has a high potential side electrode connected to a high potential side power supply line and which is ON/OFF-controllable according to a high-side gate drive signal; a low-side power switching device which has a low potential side electrode connected to a low potential side power supply line and which is ON/OFF-controllable according to a low-side gate drive signal; and an output terminal connected to a low potential side electrode of said high-side power switching device and a high potential side electrode of said low-side power switching device, said high-side power switching device and said low-side power switching device being connected in series between the high potential side power supply line and the low potential side power supply line which are to be applied with d.c. voltage; a low-side gate drive circuit to be supplied with a source voltage from a low-side gate drive power supply to generate and output a gate drive signal for said low-side power switching device according to a low-side control signal for ON/OFF-controlling said low-side power switching device; a capacitor having a one-side electrode electrically connected to said output terminal; a diode having a cathode-side electrode connected to an other-side electrode of said capacitor and an anode-side electrode through which a current from said low-side gate drive power supply flows into said diode when said low-side power switching device is turned ON; a first level shift switch which includes first and second electrodes, a control electrode and a signal output electrode, said first electrode being electrically connected to said low potential side power supply line, said second electrode being electrically connected to said other-side electrode of said capacitor, and which is configured to perform an operation such that when a first pulse is inputted to said control electrode at start of a period during which said high-side power switching device is to be kept ON, a second pulse having a potential that depends upon a potential of the other-side electrode of said capacitor and is higher than a potential of said first pulse is outputted from said signal output electrode; a second level shift switch which includes first and second electrodes, a control electrode and a signal output electrode, said first electrode being electrically connected to said low potential side power supply line, said second electrode being electrically connected to said other-side electrode of said capacitor, and which is configured to perform an operation such that when a third pulse is inputted to said control electrode at end of said period during which said high-side power switching device is to be kept ON, a fourth pulse having a potential that depends upon a potential of said other-side electrode of said capacitor and is higher than a potential of said third pulse is outputted from said signal output electrode; a signal generating circuit to be supplied with a voltage across the opposite ends of said capacitor as a source voltage and configured to generate and output a high-side control signal for turning ON said high-side power switching device in a manner timed to the output of said second pulse from said signal output electrode of said first level shift switch and turning OFF said high-side power switching device in a manner timed to the output of said fourth pulse from said signal output electrode of said second level shift switch; and a high-side gate drive circuit to be supplied with a voltage across the opposite ends of said capacitor as a source voltage and configured to generate and output a gate drive signal for said high-side power switching device according to said high-side control signal outputted from said signal generating circuit, the module comprising at least one combination of: a conductive substrate on which the semiconductor device comprising said first and second level shift switches and said diode according to any one of claims 1 to 11 and said low-side power switching device are mounted, the conductive substrate being electrically connected to said output terminal; said capacitor having said one-side electrode connected to said conductive substrate and said other-side electrode electrically connected to said second electrode of each of said two level shift switches of said semiconductor device and to said cathode-side electrode of said diode; said high-side power switching device having said low potential side electrode electrically connected to said conductive substrate; said signal generating circuit electrically connected to said signal output electrode of each of said two level shift switches of said semiconductor device and to said capacitor; and said high-side gate drive circuit electrically connected to each of said signal generating circuit, said high-side power switching device and said capacitor.

With this configuration using the semiconductor device of the present invention which can be downsized, it is possible to realize a small-sized inverter module.

In the module of the present invention, preferably, said capacitor is a chip capacitor mounted on said conductive substrate and said semiconductor device is mounted as stacked on said capacitor. This arrangement allows the module to be more downsized.

In this case, preferably, said conductive substrate on which said low-side power switching device, said chip capacitor and said semiconductor device are mounted is mounted as stacked on said low potential side electrode of said high-side power switching device. This arrangement can further the downsizing of the module.

In the module of the present invention, preferably, a chip comprising said signal generating circuit and said high-side gate drive circuit is mounted as stacked on said high-side power switching device. This arrangement allows the module to be downsized furthermore.

The present invention provides another semiconductor device comprising: a semiconductor substrate of a first conductivity type; a drift layer of the first conductivity type formed on said semiconductor substrate; a well region of a second conductivity type formed in a surface region of said drift layer exclusive of a part of the surface region; a source region of the first conductivity type formed in a predetermined region of a surface of said well region; and a RESURF region spaced apart from said source region and formed to extend over said well region and said part of the surface region of said drift layer, said RESURF region being of the first conductivity type or of a stacked structure comprising a first conductivity type semiconductor and an intrinsic semiconductor; a first electrode formed on said source region; a control electrode formed over a portion of said well region lying intermediate said source region and said RESURF region with a gate insulator intervening therebetween; a signal output electrode formed on said RESURF region; and a second electrode formed on a reverse side of said semiconductor substrate. The RESURF region is spaced apart from the source region by about 1 to about 10 µm for example.

According to this construction, a transistor device section is formed in which conduction or non-conduction between the source region connected to the first electrode and the RESURF region is controlled according to a signal inputted to the control electrode, and a resistor device section is formed between the signal output electrode on the obverse side of the semiconductor substrate and the second electrode on the reverse side of the semiconductor substrate, the resistor device section comprising a portion of the RESURF region immediately under the signal output electrode, the drift layer including the part of the surface region, and the semiconductor substrate. Thus, a level shift switch can be realized such that with a voltage applied across the first and second electrodes, a potential equal to the potential of the second electrode is outputted to the signal output electrode when the transistor device section is out of conduction while, when the transistor device section is in conduction, a potential equivalent to a voltage resulting from division of the voltage across the first and second electrodes by the resistance of the resistor device section and the internal resistance of the transistor device section, namely, a potential lower than the potential of the second electrode by a voltage drop caused by the resistor device section is outputted from the signal output electrode. Since the resistor, which has conventionally been connected externally of the chip, is formed as the resistor device section incorporated in the chip, such an external resistor and wiring thereof can be eliminated, which can contribute to the downsizing of the device (level shifter) and simplification of the wiring process.

In this semiconductor device, a channel region of the first conductivity type or of a stacked structure comprising a first conductivity type semiconductor and an intrinsic semiconductor may be formed immediately under said gate insulator to interconnect said source region of the first conductivity type and said RESURF region of the first conductivity type or of said stacked structure comprising a first conductivity type semiconductor and an intrinsic semiconductor. This arrangement allows the threshold voltage of the transistor device section to be adjusted.

The "wide bandgap semiconductor", as used in the present description, means a semiconductor having a bandgap of not less than 2.0 eV. The bandgap is an energy difference between the lower edge of a conduction band and the upper edge of a valence band. Examples of such wide bandgap semiconductors include silicon carbide (SiC), group III nitrides such as GAN and AlN, and diamond.

The foregoing and other objects, features and attendant advantages of the present invention will become more apparent from the reading of the following detailed description of the preferred embodiments in conjunction with the accompanying drawings.

Advantage of Invention

The present invention having the arrangements described above has the advantage of being capable of providing a semiconductor device for use in an inverter device or a like device which can contribute to the downsizing of such an inverter device, as well as a module using such a semiconductor device.

DESCRIPTION OF REFERENCE CHARACTERS

Figure 1:
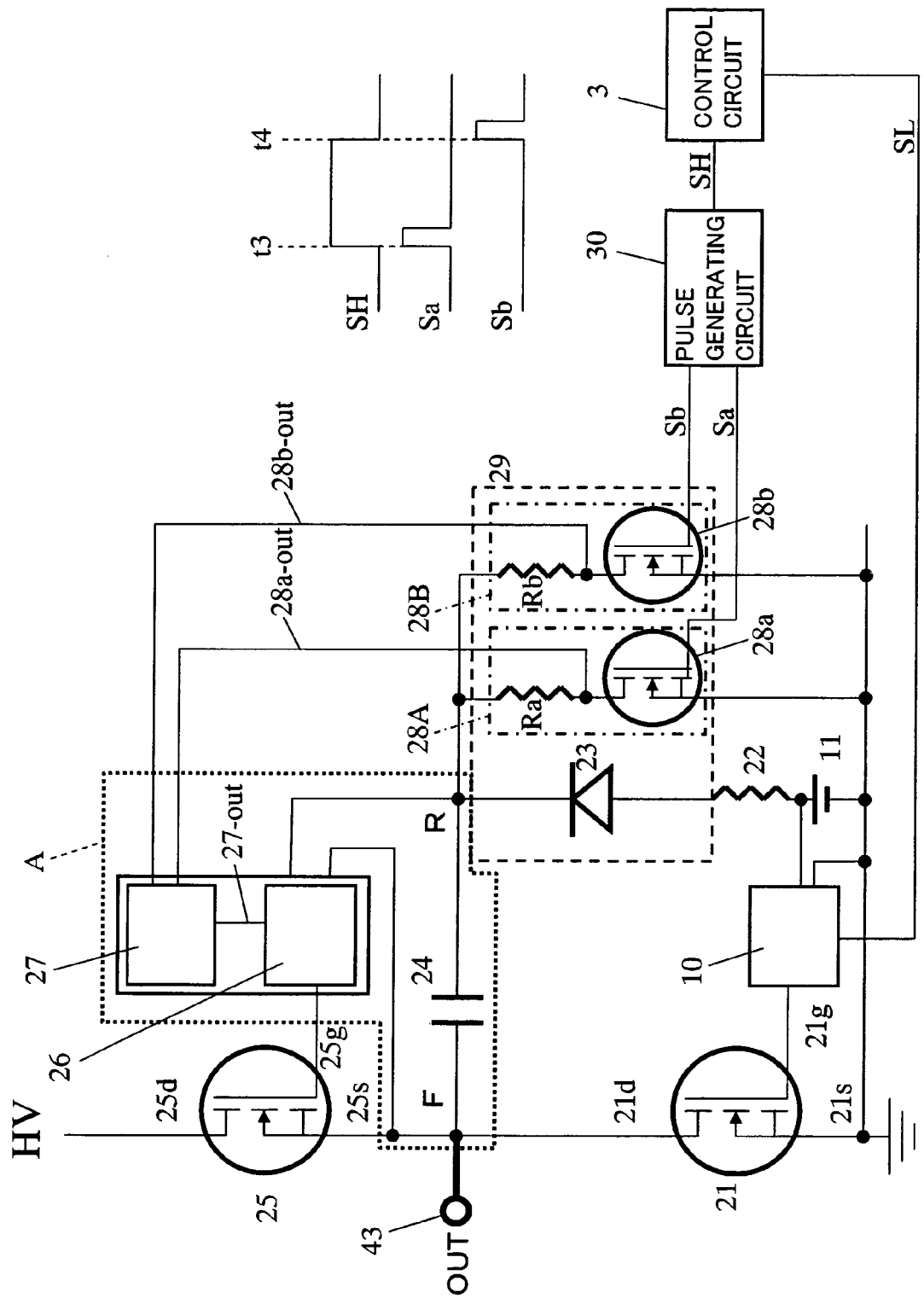
FIG. 1 is a circuit diagram showing one exemplary circuit configuration of an inverter according to an embodiment of the present invention.

1 . . . three-phase motor
2 . . . low-voltage power supply
3 . . . control circuit
4 . . . high-voltage power supply
5H . . . high-side power switching device
5L . . . low-side power switching device
6 . . . high-side gate drive circuit
7 . . . high-potential floating power supply
8 . . . photodiode
9 . . . LED
10 . . . low-side gate drive circuit
11 . . . low-side gate drive power supply
21 . . . low-side power switching device
21s . . . source electrode
21g . . . gate electrode
21d . . . drain electrode
22 . . . resistor
23 . . . diode
24 . . . bootstrap capacitor
25 . . . high-side power switching device
25s . . . source electrode
25d . . . drain electrode
26 . . . high-side gate drive circuit
27 . . . flip-flop circuit
28A,28B . . . resistor-incorporating level shift switch
28a,28b . . . level shift switch
29 . . . integrated chip
31 . . . insulating plate
41 . . . chip capacitor
42 . . . conductive plate
43 . . . inverter output terminal
50s . . . wide bandgap semiconductor substrate of the first conductivity type
50d . . . drift layer of the first conductivity type
51 . . . Schottky electrode
52a,52b . . . mesa isolation section
53a,53b . . . well region of the second conductivity type
54 . . . source region of the first conductivity type
55 . . . channel region of the first conductivity type or of a stacked structure comprising a first conductivity type semiconductor and an intrinsic semiconductor
56 . . . RESURF region of the first conductivity type or of a stacked structure comprising a first conductivity type semiconductor and an intrinsic semiconductor
57 . . . JFET region
58s . . . source region
58g . . . gate electrode
58o . . . output electrode
58d . . . common electrode
59 . . . gate insulator

BEST MODE FOR CARRYING OUT THE INVENTION

Hereinafter, preferred embodiments of the present invention will be described with reference to the drawings.

Embodiment

[Level Shift Circuit]

Figure 10:
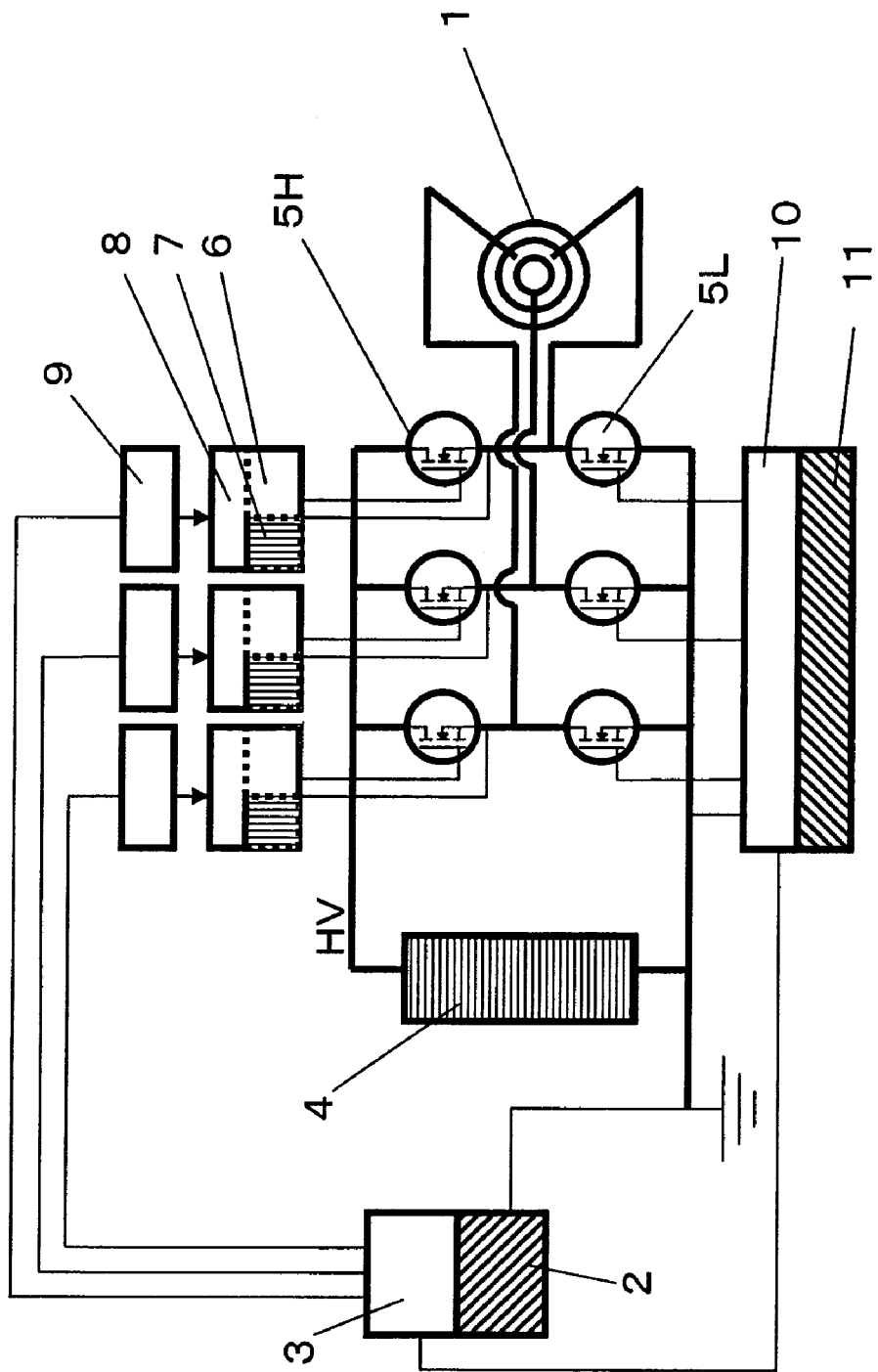
FIG. 10 is a conceptual view showing a conventional inverter for use in motor control.

A semiconductor device according to an embodiment of the present invention is a level shift circuit for use in an inverter for motor control as shown in FIG. 10 for example. The circuit configuration of this inverter shown in FIG. 10 is characterized by the arrangement of a portion for controlling high-side power switching devices 5H.

FIG. 1 is a circuit diagram showing one exemplary circuit configuration of an inverter according to the embodiment of the present invention. In FIG. 1, one pair of low-side and high-side power switching devices (one phase) is picked out of, for example, three pairs of low-side and high-side power switching devices (three phases) as shown in FIG. 10.

The high-side power switching device 25 (designated by 5H in FIG. 10) and the low-side power switching device 21 (designated by 5L in FIG. 10) are connected in series and a high-voltage power supply 4 (see FIG. 10) is connected to the opposite ends of the series. The low-side power switching device 21 is controlled by a gate drive circuit 10. A low-side power supply 11 supplies voltage to be applied to a gate electrode 21g via the gate drive circuit 10. This power supply 11 is connected to a drain electrode 21d of the low-side power switching device 21 via a resistor 22, a high withstand voltage diode 23 and a capacitor 24. This portion functions as a bootstrap power supply for storing voltage from the power supply 11 in the capacitor 24 when the low-side power switching device 21 is ON (in conduction). The drain electrode 21d of the low-side power switching device 21 is also connected to an output terminal 43 as well as a source electrode 25s of the high-side power switching device 25. A drain electrode 25d of the high-side power switching device 25 is connected to a power supply line applied with a potential HV on the high potential side of the high voltage power supply 4 (see FIG. 10).

The voltage stored in the capacitor 24 is supplied as a source voltage to be applied to a gate drive circuit 26 and a flip-flop circuit 27.

The gate drive circuit 26 in an electrically floating condition applies a gate electrode 25g of the high-side power switching device 25 with either the potential of the source electrode 25s of the high-side power switching device 25 (potential of a node F) or a potential (potential of a node R) higher than the potential of the source electrode 25s by a value corresponding to a voltage across the opposite ends of the capacitor 24 (voltage across F-R). The gate drive circuit 26 selects and outputs the potential of the node F or the potential of the node R according to a control signal 27-out inputted thereto from the flip-flop circuit 27. Two level shift switches 28a and 28b each comprising an nMOSFET input pulse signals 28a-out and 28b-out which are different in timing to the flip-flop circuit 27, which in turn outputs the control signal 27-out in the form of rectangular wave to the gate drive circuit 26. The pulse signals 28a-out and 28b-out transferred from the two level shift switches 28a and 28b determine the rise timing and fall timing of the rectangular wave outputted from the flip-flop circuit 27. Such a rectangular wave functions as a gate control signal for the high-side power switching device 25. The two level shift switches 28a and 28b are controlled by pulse signals Sa and Sb outputted from a pulse generating circuit 30 which generates the pulse signals Sa and Sb from a high-side control signal SH outputted from a control circuit 3. The control circuit 3 outputs the high-side control signal SH to the pulse generating circuit 30 while outputting a low-side control signal SL to the gate drive circuit 10. The low-side gate drive circuit 10 applies the voltage of the low-side power supply 11 to the gate electrode 21g of the power switching device 21 to keep the power switching device 210N while the low-side control signal SL is at a high level for example. The high-side control signal SH outputted from the control circuit 3 as well as the low-side control signal SL is a signal relative to the ground potential serving as a reference.

In this circuitry, the potential of the node F interconnecting the low-side power switching device 21 and the high-side power switching device 25 varies between the ground potential and the positive potential HV on the high potential side depending upon the operating conditions of the switching devices 21 and 25. Accordingly, the potential to be applied to the gate electrode 25*a* of the high-side power switching device 25 needs to be controlled under a condition that a portion enclosed by dotted line A in FIG. 1 is floating. It is the level shift switches 28*a* and 28*b* that shift the levels of the control signals to be fed to this floating portion.

Figure 3:
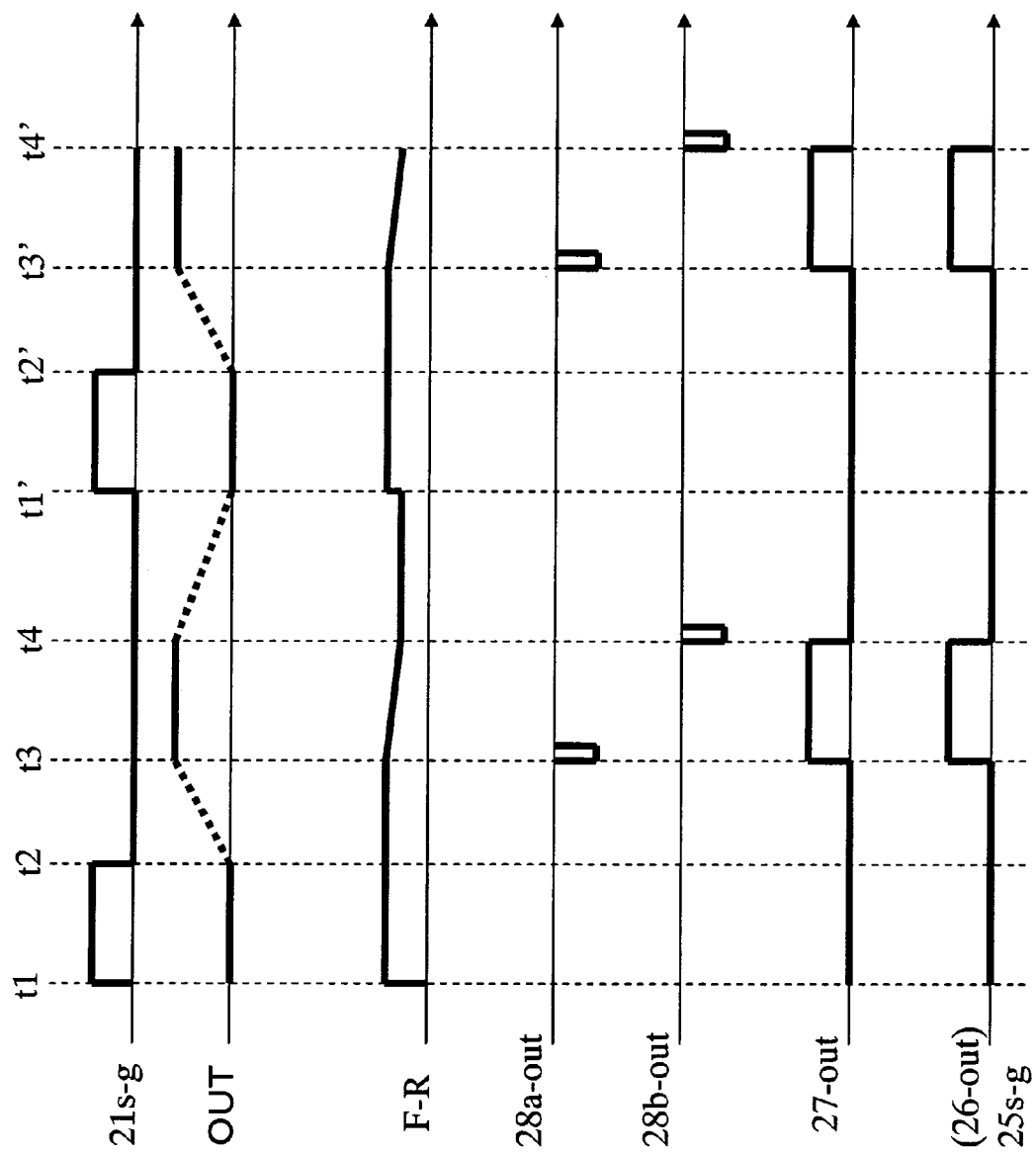
FIG. 3 is a timing chart of signals at different sections of the inverter according to the embodiment of the present invention.

The operation of the configuration shown in FIG. 1 will be described in more detail with reference to FIG. 3. FIG. 3 is a timing chart of signals at different sections of the configuration shown in FIG. 1.

Initially, the low-side control signal SL outputted from the control circuit 3 drives the low-side gate drive circuit 10 to ON (in conduction)/OFF (out of conduction)-control the low-side power switching device 21. At time t1 in FIG. 3, the gate drive circuit 10 applies a gate bias 21*s*-*g* to the switching device 21 and then it turns ON, whereby the potentials of the output terminal 43 (OUT) and the one-side end (node) F of the capacitor 24 each assume the ground potential. At that time, the potential of the power supply 11, relative to the ground potential at the one-side end F of the capacitor 24 is applied to the other-side end of the capacitor 24 via the resistor 22 and the diode 23 to charge the capacitor 24, so that the voltage across F-R rises.

When the switching device 21 becomes free of the gate bias 21*s*-*g* at time t2, the switching device 21 turns OFF and, hence, the potential of the output terminal 43 (OUT) and the potential of the one-side end F of the capacitor 24 vary due to the load. Even when the potential of the one-side end F of the capacitor 24 varies, the voltage across F-R does not vary because the charge stored in the capacitor 24 is conserved.

When the control circuit 3 outputs the high-side control signal SH as shown in FIG. 1, the pulse generating circuit 30 detects the leading edge and falling edge of the control signal SH and then generates the pulse signal Sa and the pulse signal Sb in response to respective of the detections of the leading edge and the falling edge during the period from time t3 to time t4. While the pulse signal Sa is being outputted, the level shift switch 28*a* is kept ON. While the level shift switch 28*a* is kept ON, the pulse signal 28*a*-out is outputted (at time t3). While the pulse signal Sb is being outputted, the level shift switch 28*b* is kept ON. While the level shift switch 28*b* is kept ON, the pulse signal 28*b*-out is outputted (at time t4). Here, the potential of the pulse signal 28*a*-out is a potential equivalent to a voltage resulting from division of the voltage corresponding to difference between the potential of the terminal (node) R of the capacitor 24 and the ground potential upon output of the pulse signal 28*a*-out by the resistance of a resistor Ra and the internal resistance of the level shift switch 28*a*, namely, a potential lower than the potential of the terminal R of the capacitor 24 by value equivalent to a voltage drop caused by the resistor Ra. Similarly, the potential of the pulse signal 28*b*-out is a potential equivalent to a voltage resulting from division of the voltage corresponding to difference between the potential of the terminal R of the capacitor and the ground potential upon output of the pulse signal 28*b*-out by the resistance of a resistor Rb and the internal resistance of the level shift switch 28*b*, namely, a potential lower than the potential of the terminal R of the capacitor 24 by a value equivalent to a voltage drop caused by the resistor Rb. The pulse potentials of the respective pulse signals 28*a*-out and 28*b*-out are higher than the pulse potentials of the respective pulse signals Sa and Sb.

When the level shift switch 28*a* inputs the pulse signal 28*a*-out to the flip-flop circuit 27 in a floating condition at time t3, the output 27-out of the flip-flop circuit 27 becomes high and, accordingly, the high-side gate drive circuit 26 produces an output 26-out equal to the potential of the node R to apply a gate bias 25*s*-*g* to the high-side power switching device 25. Then, the high-side power switching device 25 turns ON, so that the potential OUT of the output terminal 43 and the potential of the one-side end F of the capacitor 24 each assume the high potential HV.

When the level shift switch 28*a* inputs the pulse signal 28*b*-out to the flip-flop circuit 27 at time t4, the output 27-out of the flip-flop circuit 27 becomes low and, accordingly, the high-side gate drive circuit 26 produces the output 26-out equal to the potential of the node F, so that the gate bias 25*s*-*g* applied to the high-side power switching device 25 becomes zero. Then, the high-side power switching device 25 turns OFF, thus allowing the potential OUT of the output terminal 43 and the potential of the one-side end F of the capacitor 24 to vary due to the load.

Thereafter, the circuit shown in FIG. 1 repeats the operations thus performed during the period from time t1 to time t4 to serve as an inverter.

Figure 2:
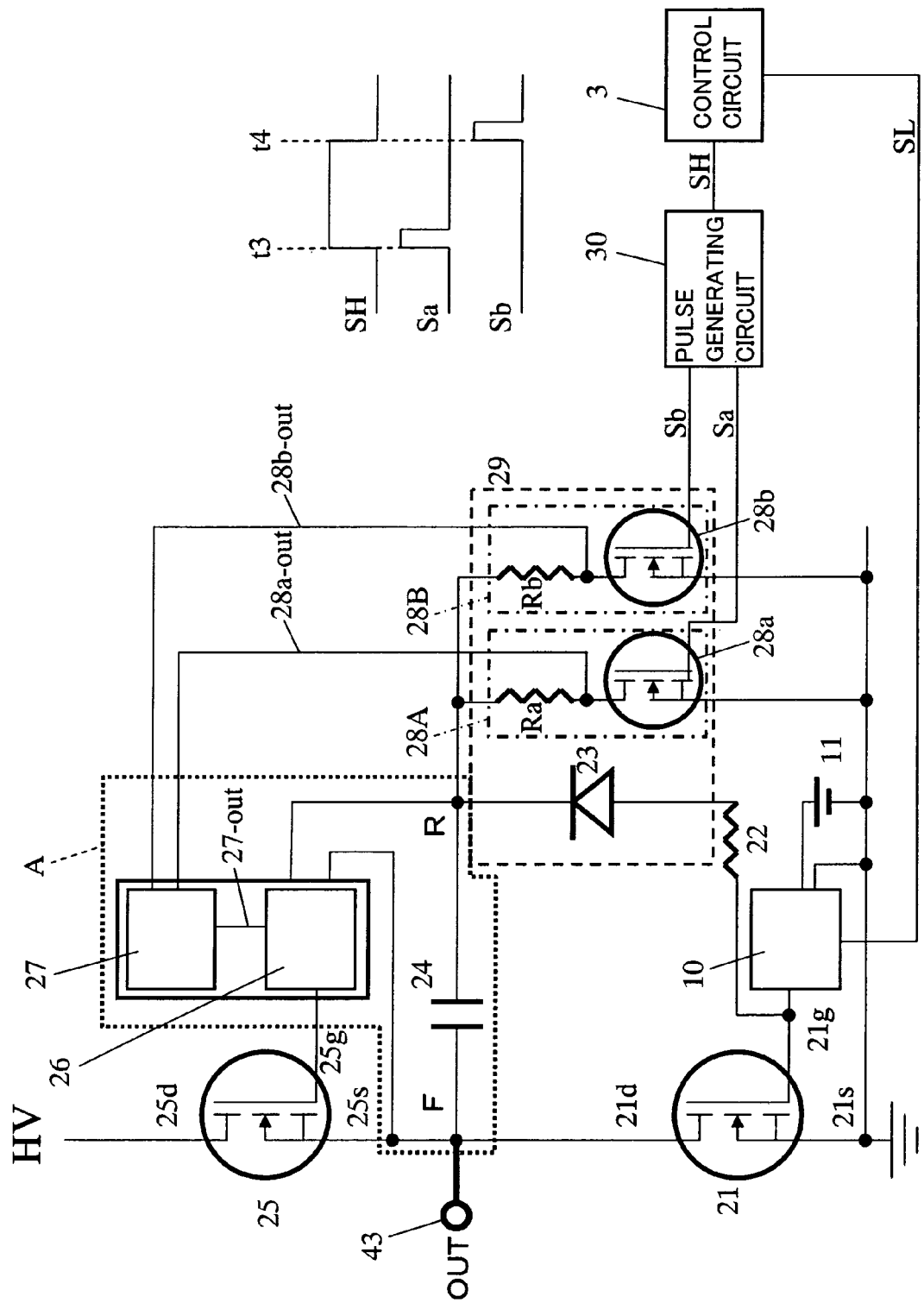
FIG. 2 is a circuit diagram showing another exemplary circuit configuration of the inverter according to the embodiment of the present invention.

A variation of the circuit configuration as shown in FIG. 2 is possible. The circuit configuration shown in FIG. 2 is different from that shown in FIG. 1 only in that the resistor 22 forming part of the bootstrap power supply is connected to the output line of the low-side gate drive circuit 10 instead of being directly connected to the low-side gate drive power supply 11. The circuit configuration having the resistor 22 thus connected operates like the circuit configuration of FIG. 1. That is, in the case of FIG. 2 the voltage of the power supply 11 is applied to the switching device 21 from the gate drive circuit 10 during a period for which the switching device 21 is to be held ON and, hence, the switching device 21 is held ON to charge the capacitor 24 while the voltage of the power supply 11 is being applied. For this reason, the circuit configuration of FIG. 2 operates in the same way as the circuit configuration of FIG. 1.

While each of the configurations shown in FIGS. 1 and 2 includes the pulse generating circuit 30 for receiving the high-side control signal SH and generating the pulse signals Sa and Sb, the control circuit 3 may be configured to generate the pulse signals Sa and Sb and input these signals directly to the level shift switches 28*a* and 28*b*. Though FIGS. 1 and 2 each show the circuit configuration for one phase only, the control circuit 3 outputs control signals SL and SH for plural phases, for example, three phases if there are plural phases. It is possible that the pulse generating circuit 30 is provided for each phase or that the pulse generating circuit 30 is configured to receive the control signals SH for the respective phases and output the pulse signals Sa and Sb for a respective one of the plural phases. Alternatively, the control circuit 30 may be configured to generate the pulse signals Sa and Sb for each of the plural phases and input these signals to the level shift switches 28*a* and 28*b* in each phase. In the case of the control circuit 3 adapted to output the pulse signals Sa and Sb, the control circuit 3 is simply configured to output the pulse signal Sa to the level shift switch 28*a* at the time the period during which the high-side power switching device 25 is kept ON starts and the pulse signal Sb to the level shift switch 28*b* at the time the period terminates.

In the embodiment of the present invention, a portion enclosed by dotted line (hereinafter will be referred to as a level shift circuit) in each of FIGS. 1 and 2 is integrated on one wide bandgap semiconductor substrate of one chip (integrated chip 29). A withstand voltage characteristic is critical to each of the level shift switches 28a and 28b and the diode 23 of this level shift circuit. Since the level shift switches 28a and 28b form part of the gate control circuit associated with the power switching device 25, these switches do not need any high current and hence can be integrated as a small-sized semiconductor device. By integrating this part of the gate control circuit requiring such a withstand voltage characteristic, the parts count can be lowered, which allows, for example, an inverter module to be downsized. The level shift circuit (integrated chip 29) requiring such a withstand voltage characteristic comprises a part of the bootstrap power supply and the level shift switches, which are circuit components having different circuit functions. For this reason, there has heretofore been no idea of integrating these components.

In the integration according to the embodiment of the present invention, the level shift switch 28a and the resistor Ra are formed into one device as a resistor-incorporating level shift switch 28A, while the level shift switch 28b and the resistor Rb formed into one device as a resistor-incorporating level shift switch 28B. By so doing, the terminals of respective of the level shift switches 28A and 28B and the diode 23 on one side are commonly connected to the one-side terminal R of the capacitor 24. This arrangement makes it easy to make integration into one chip.

Figure 4:
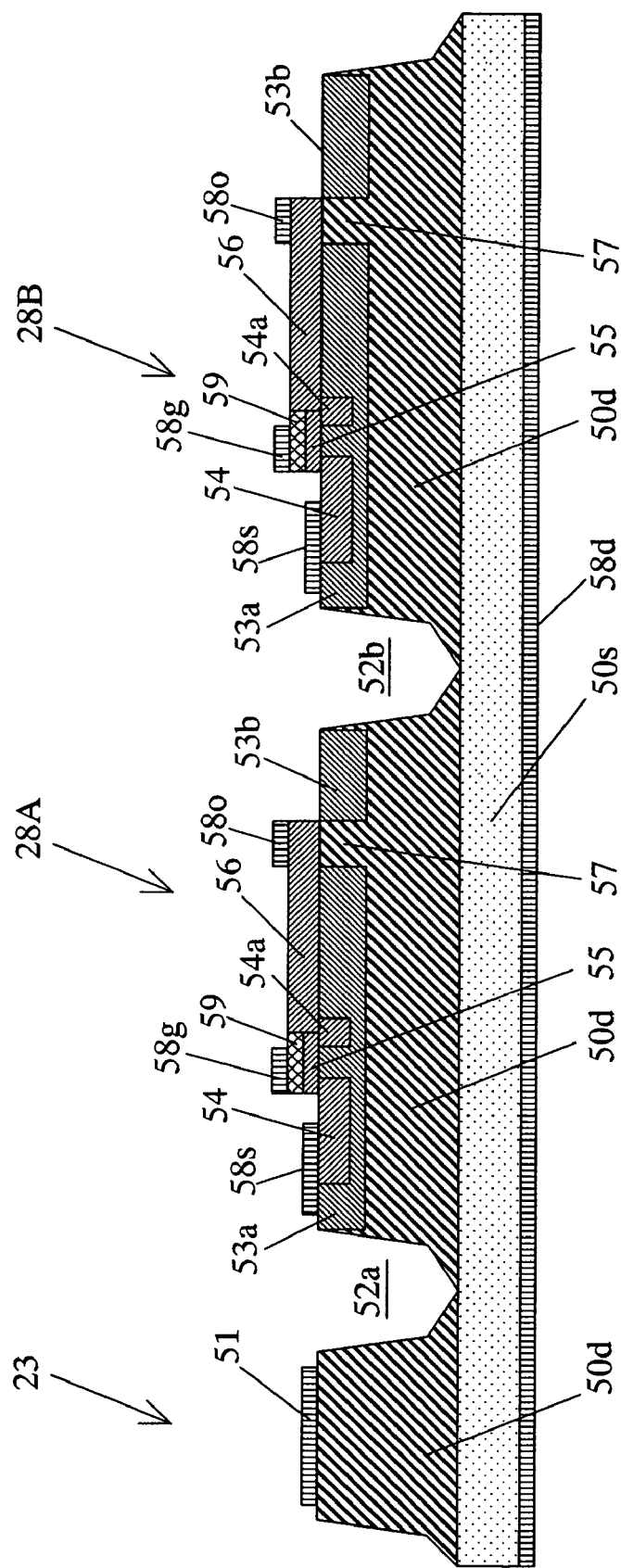
FIG. 4 is a sectional view showing one exemplary sectional structure of a semiconductor device (integrated chip) according to the embodiment of the present invention.

FIG. 4 is a sectional view showing the sectional structure of the integrated chip 29. In this example shown, a Schottky diode is used as the diode 23 and a mesa isolation structure formed to device-isolate the diode 23, the resistor-incorporating level shift switch 28A and the resistor-incorporating level shift switch 28B from each other.

The diode 23 is the Schottky diode in which a Schottky electrode 51 placed on the surface of a drift layer 50d of a first conductivity type formed on a wide bandgap semiconductor substrate of the first conductivity type (n type for example). The Schottky diode is electrically isolated from other devices by being surrounded by a mesa isolation section 52a.

The resistor-incorporating level shift switch 28A comprises a vertical-type MOSFET including a RESURF structure, the MOSFET lying adjacent to the diode 23 but isolated therefrom by the mesa isolation section 52a. Well regions 53a and 53b of a second conductivity type (p type for example) are formed over the drift layer 50d of the first conductivity type exclusive of a localized region (JFET region 57) of the drift layer 50d. In the well region 53a of the second conductivity type, a source region 54 of the first conductivity type and a region 54a of the first conductivity type spaced apart from the source region 54 are formed by ion implantation. On the surface of the well region 53a of the second conductivity type, a channel region 55 and a RESURF region 56 are formed continuously with the source region 54, each of the channel region 55 and the RESURF region 56 being of the first conductivity type or of a stacked structure comprising a first conductivity type semiconductor and an intrinsic semiconductor. The RESURF region 56 is connected to the JFET region 57 of the first conductivity type intervening between the well region 53a and the other well region 53b of the second conductivity type. The RESURF region 56 is spaced apart from the source region 54 by about 1 to about 10 μm for example. A source electrode 58s is provided on the source region 54, and a surface of the channel region 55 is covered with a gate insulator 59 on which a gate electrode 58g is formed. An output electrode 58o is formed on a surface of the RESURF region 56 located above the junction between the RESURF region 56 and the JFET region 57.

The resistor-incorporating level shift switch 28B, which is formed to have the same structure as the resistor-incorporating level shift switch 28A, lies adjacent to the resistor-incorporating level shift switch 28A but is isolated therefrom by a mesa isolation section 52b. The disposition of the diode 23 and the resistor-incorporating level shift switches 28A and 28B in integrated chip 29 may be any disposition without any limitation to that shown in FIG. 4.

On the reverse side of the integrated chip 29, the cathode-side electrode of the diode 23 and the drain electrodes of respective of the vertical-type MOSFETs forming the resistor-incorporating level shift switches 28A and 28B are integrated into a common electrode 58d, which is connected to the node R connected to the one-side end of the capacitor 24 shown in FIG. 1. In the present embodiment, the portions other than the electrodes 51, 58d, 58s, 58g and 58o and the gate insulator 59 each is formed by a wide bandgap semiconductor in FIG. 4.

Since the source electrode 58s of each of the resistor-incorporating level shift switches 28A and 28B is applied with the ground potential, the channel region 55 of each MOSFET is OFF (out-of-conduction condition) and the potential of the output terminal 58o is equal to that of the common electrode 58d when the gate electrode 58g is applied with not a positive potential but a potential equal to the potential of the source electrode 58s. On the other hand, when the gate electrode 58g is applied with a positive potential to turn ON the channel region 55 (in-conduction condition), a voltage drop occurs due to current passing from the common electrode 58d, through the substrate 50s, drift region 50d, the JFET region 57, the RESURF region 56, the channel region 55 and the source region 54, to the source electrode 58s, so that a potential lower than the potential of the common electrode 58 by the product obtained by multiplication of the electrical resistance between the common electrode 58d and the output electrode 58o (the resistance corresponding to the resistor Ra or Rb in FIG. 1, i.e., the total electrical resistance of a portion of the RESURF region 56 immediately under the output electrode 58o, the JFET region 57, the drift region 50d and the substrate 50s) and the current passing therethrough is outputted to the output electrode 58o. The potential to be outputted from the output terminal 58o at that time can be set to a desired potential by adjusting the electrical resistance between the common electrode 58d and the output electrode 58o (the resistance corresponding to the resistor Ra or Rb in FIG. 1) and the electrical resistance of the RESURF region 56 extending between the output electrode 58o and the channel region 55 (the resistance substantially corresponding to the internal resistance of the level shift switch 28a or 28b of FIG. 1) in the circuit design. The output electrodes 58o of the respective resistor-incorporating level shift switches 28A and 28B output their respective potentials as the pulse signals 28a-out and 28b-out indicated at FIG. 1 to the flip-flop circuit 27.

The resistor-incorporating level shift switches 28A and 28B thus constructed have incorporated therein the respective resistors Ra and Rb shown in FIG. 1, which have conventionally been included in external circuitry. For this reason, it is possible to eliminate such external resistors and wiring thereof, hence, downsize the device and eliminate wires and wiring thereof for external circuitry. This advantage can be obtained not only in cases where the resistor-incorporating level shift switches 28A and 28B are formed using a wide bandgap semiconductor as in the present embodiment but also in cases where such level shift switches are formed using a Si semiconductor.

Though there is no need to provide the channel region 55 of the first conductivity type or of the stacked structure comprising the first conductivity type semiconductor and the intrinsic semiconductor immediately under the gate insulator 59, the provision of the channel region 55 makes it possible to adjust the threshold voltage of the MOSFET. In cases where the level shift switches 28A and 28B are formed using such a wide bandgap semiconductor as SiC as in the present embodiment, in particular, the threshold voltage rises if the channel region 55 of the first conductivity type or of the stacked structure comprising the first conductivity type semiconductor and the intrinsic semiconductor is not provided. Thus, the provision of the channel region 55 enables the threshold voltage to lower. With the channel region 55, the channel region 55 forms a FET channel region, while, without the channel region 55, a surface region and its adjacent region of a portion of the well region 53a lying just below the gate electrode 58g form a FET channel region.

Figure 5:
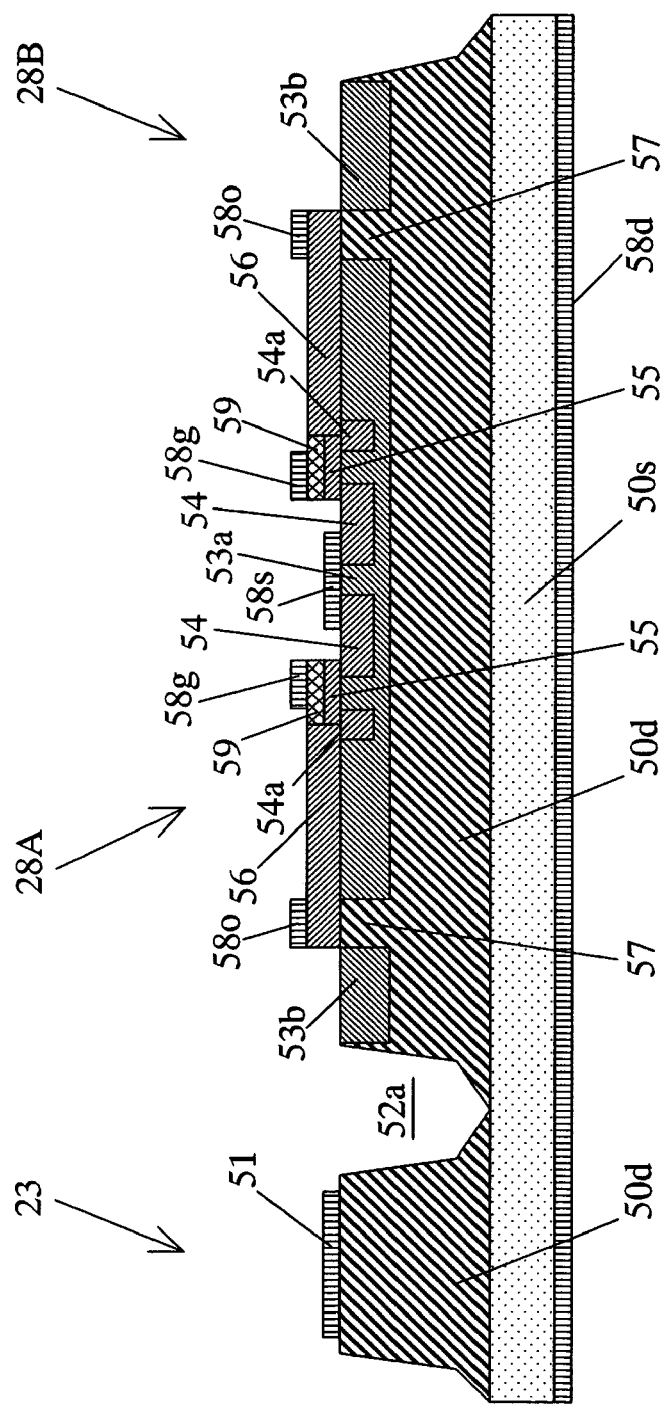
FIG. 5 is a sectional view showing another exemplary sectional structure of the semiconductor device (integrated chip) according to the embodiment of the present invention.

Further, because the level shift switches 28A and 28B may share a common source electrode 58s, it is possible that such a common source electrode 58s to be shared by the two level shift switches 28A and 28B is provided and that the two level shift switches 28A and 28B are symmetric in structures with respect to the common source electrode 58s as shown in FIG. 5.

A p-n junction diode may be used as the diode 23. However, the use of a Schottky diode as in the present embodiment ensures a smaller drop in forward voltage, hence, a higher-speed operation.

Figure 6:
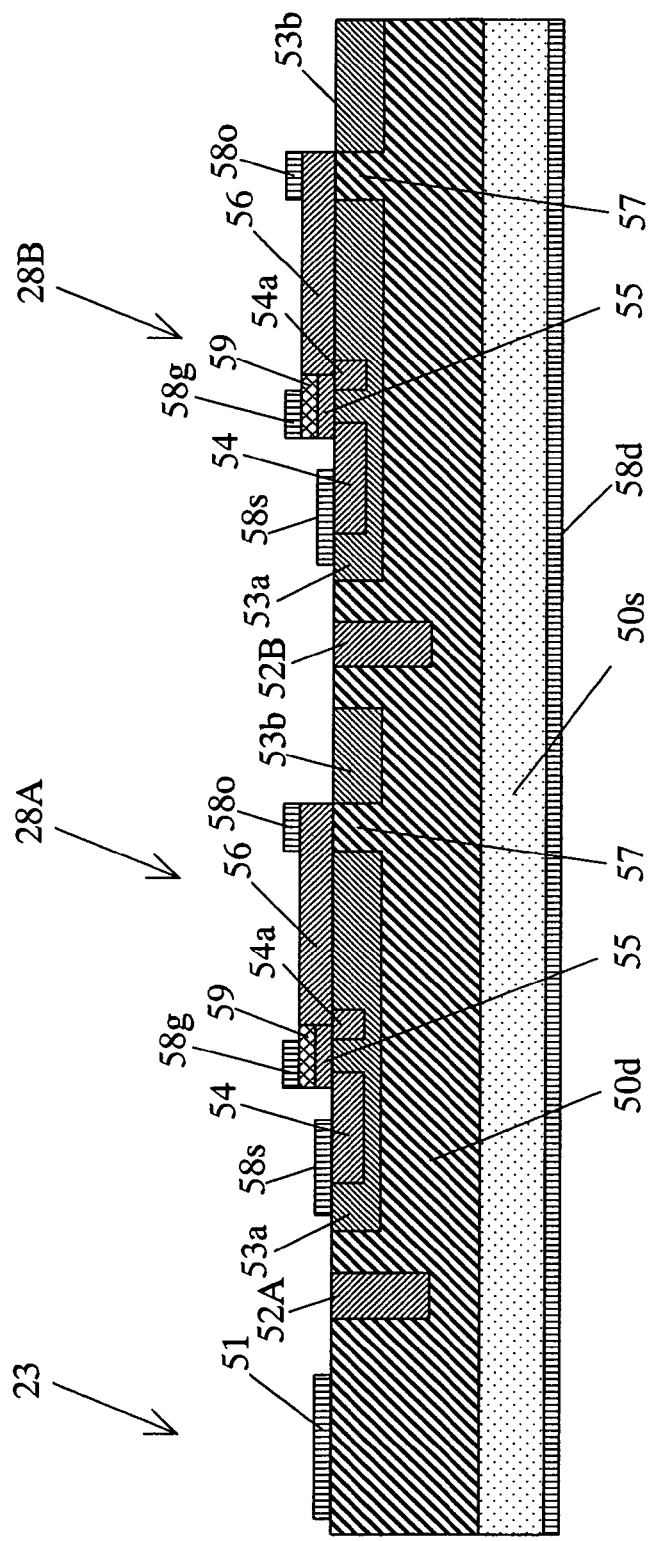
FIG. 6 is a sectional view showing yet another exemplary sectional structure of the semiconductor device (integrated chip) according to the embodiment of the present invention.

While device isolation is made by the mesa isolation sections 52a and 52b in FIG. 4, it is possible to provide device isolation regions 52A and 52B each comprising a second conductivity type region forming a p-n junction with the drift layer 50d of the first conductivity type as shown in FIG. 6 instead of the mesa isolation section 52a and 52b. In the case of FIG. 5, similarly, it is possible to provide the device isolation region 52A comprising a second conductivity type region forming a p-n junction with the drift layer 50d of the first conductivity type as shown in FIG. 6 instead of the mesa isolation region 52a.

[Inverter Module]

Figure 7:
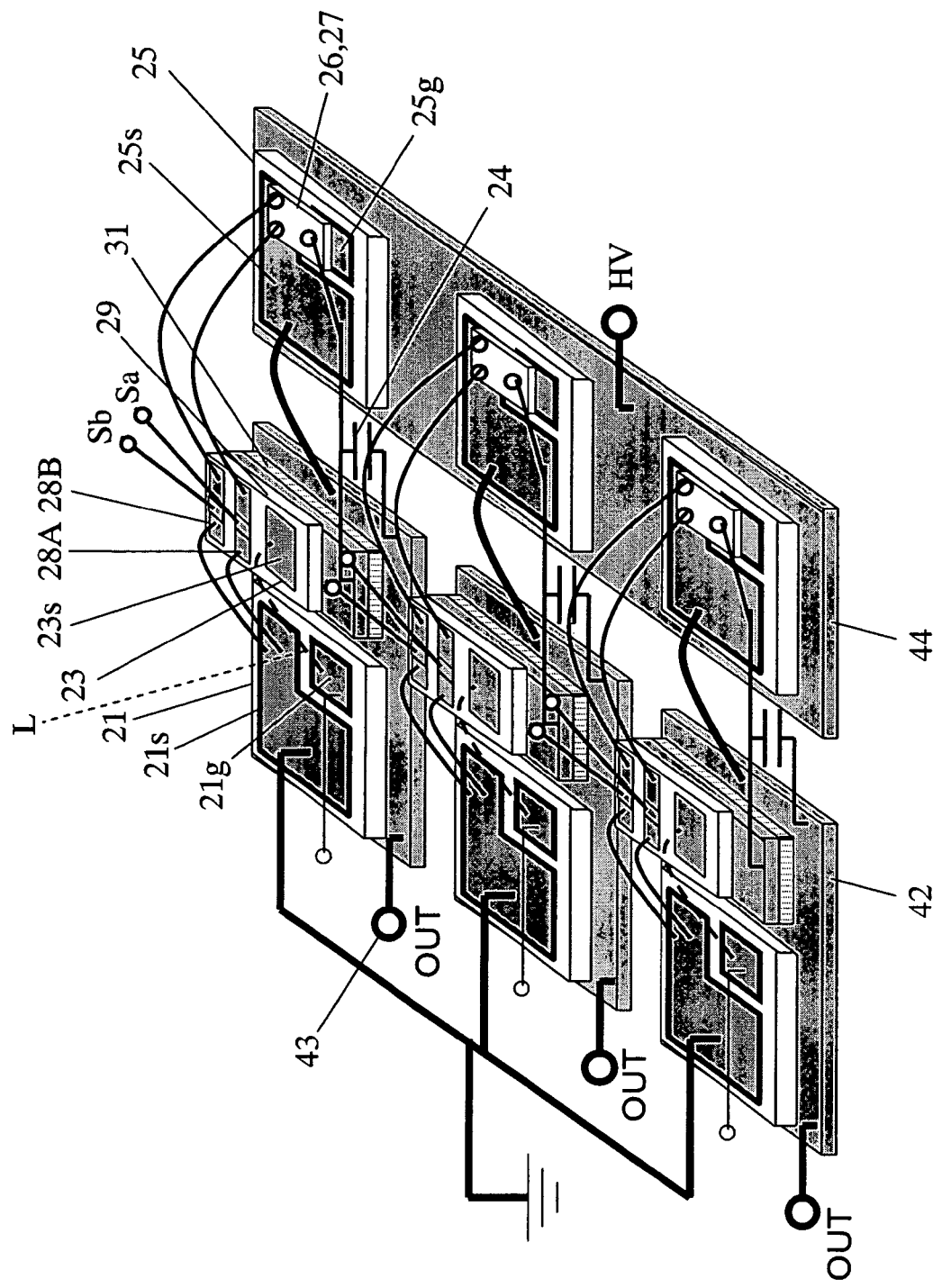
FIG. 7 is a conceptual view showing one exemplary configuration of an inverter module according to the embodiment of the present invention.
Figure 8:
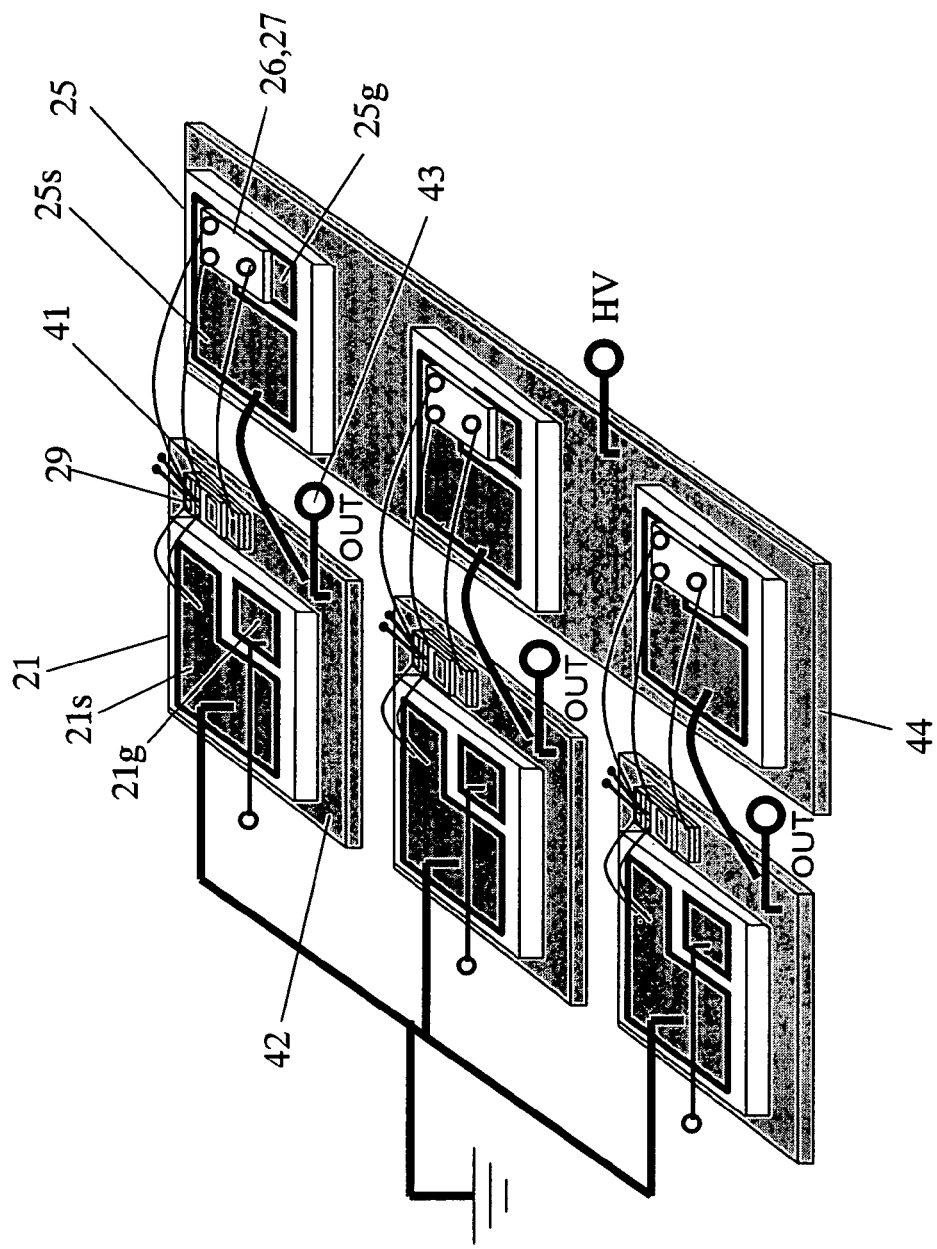
FIG. 8 is a conceptual view showing another exemplary configuration of the inverter module according to the embodiment of the present invention.
Figure 9:
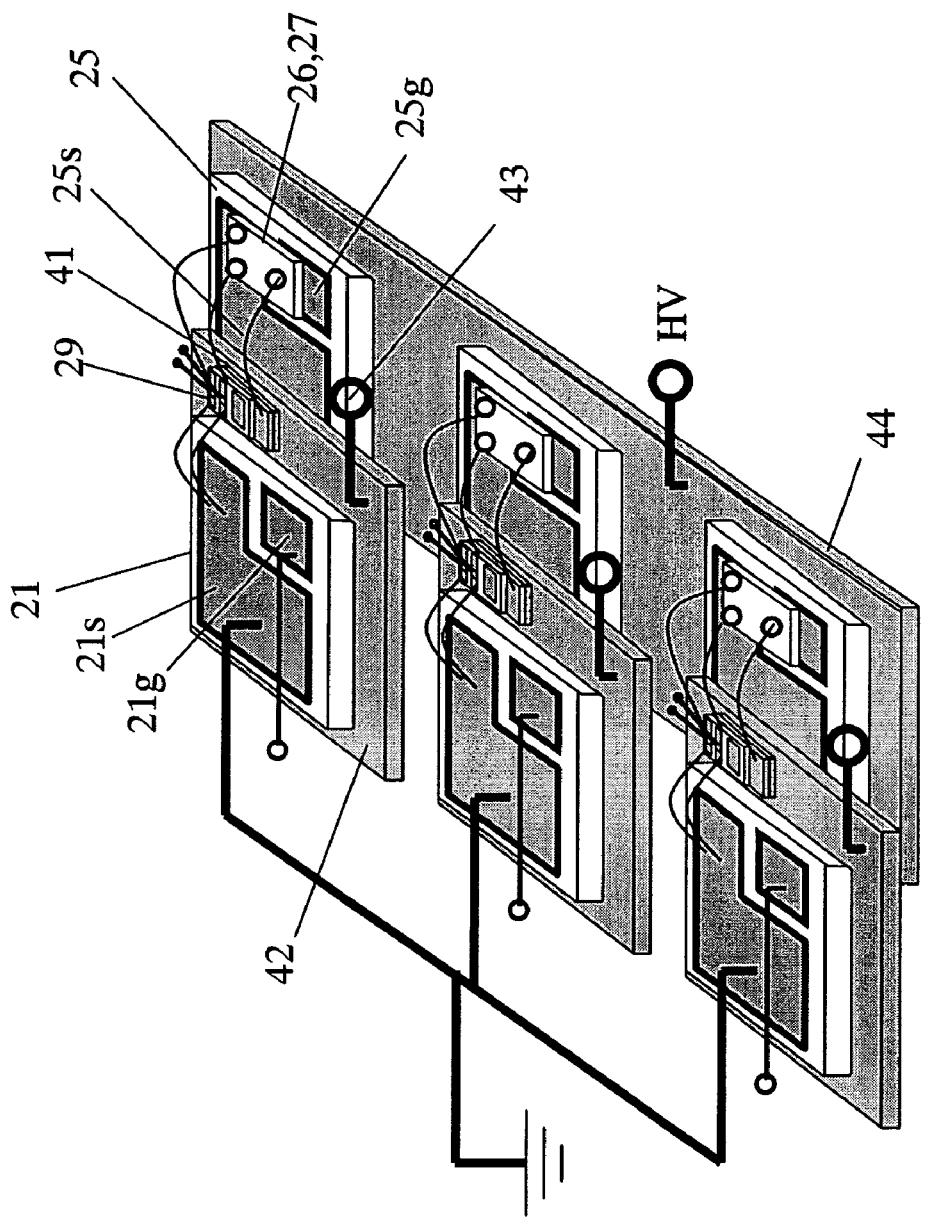
FIG. 9 is a conceptual view showing yet another exemplary configuration of the inverter module according to the embodiment of the present invention.

FIGS. 7 to 9 are each a conceptual view showing an inverter module constructed using the integrated chip 29 comprising the level shift circuit described above. In each of FIGS. 7 to 9, there are three parallel output terminals 43 (OUT) to be connected to the load on the inverter module for driving a three-phase motor (see FIG. 10) for example. In each of FIGS. 7 to 9, the low-side and high-side power switching devices 21 and 25 are each formed using a wide bandgap semiconductor except the gate insulator and the electrodes and each comprise a chip constituted by a vertical nMOSFET in which a drain electrode is formed on the reverse side of the vertical nMOSFET. In each of FIGS. 7 to 9, the source electrode 21s and the gate electrode 21g of each low-side power switching device 21 and the source electrode 25s and the gate electrode 25g of each high-side power switching device 25 are each shown by a pad thereof formed on a chip surface for connection with external circuitry. The source electrodes 21s of the three low-side power switching devices 21 are respectively electrically connected to the source electrodes 58s (see FIG. 4) of the respective three pairs of resistor-incorporating level shift switches 28A and 28B integrated on respective chips 29, as well as to the power supply line applied with the ground potential. The drain electrodes located on the reverse sides of the respective power switching devices 21 are connected to respective of conductive plates 42 each comprising a metal plate or the like. Each of the conductive plates 42 is connected to a respective one of the output terminals 43 while being electrically connected to the source electrode 21 of the high-side power switching device 25 paired with the associated one of the low-side power switching devices 21.

The three high-side power switching devices 25 are mounted on a common conductive plate 44 comprising a metal plate or the like, while the drain electrodes located on the reverse sides of the respective switching devices 25 connected to the conductive plate 44. This conductive plate 44 is connected to the power supply line applied with the potential HV from the high potential side of the high voltage power supply 4 (see FIG. 10). The gate drive circuit 26 and the flip-flop circuit 27 electrically connected to the output electrodes 58o (see FIG. 4) of the respective resistor-incorporating level shift switches 28A and 28B integrated on the integrated chip 29 are packaged as one chip stacked on each of the high-side power switching devices 25 and operate in a floating condition. The driving voltage to be supplied to this chip is generated by electric charge stored in the capacitor 24 of the bootstrap power supply. Here, each of the gate drive circuit 26 and the flip-flop circuit 27 may comprise either a Si semiconductor or a wide bandgap semiconductor. The chip incorporating the gate drive circuit 26 and the flip-flop circuit 27 has a reverse side provided with a pad for connection with the source electrode 25s of the associated power switching device 25 and a pad for connection with the associated gate electrode 25g, the pads being connected to respective of these electrodes.

Though the integrated chip 29 is shown as somewhat enlarged in FIG. 7 so that its shape and condition can be viewed clearly, the integrated chip 29 does not need to control any high current unlike the other power switching device 21 or the like and hence is usually sized as small as ⅒ of the power switching device 21 or smaller. In the case of FIG. 7, the integrated chip 29 is mounted as stacked on the conductive plate 42 equipped with the low-side power switching device 21 with an intervening insulating plate therebetween. It was confirmed that such an arrangement facilitated wiring and a like process and hence made it possible to realize a small-sized module easily. In the case of FIG. 7, the capacitor 24, which is included in the external circuitry, has its one-side terminal F (see FIGS. 1 and 2) connected to the conductive plate 42 and the other-side terminal R (see FIGS. 1 and 2) connected to the common electrode 58d (see FIG. 4) of the integrated chip 29 as well as to the chip incorporating the gate drive circuit 26 and the flip-flop circuit 27.

As shown in FIG. 8, if a chip capacitor 41 (i.e., the capacitor 24 shown in FIG. 1), such as a stacked dielectric capacitor for example, is provided instead of the insulating plate 31 of FIG. 7, any external capacitor and wiring thereof can be eliminated, which leads to a further small-sized module. This chip capacitor 41 has electrodes on respective of the upper and lower sides of the chip, the electrode on the lower side (terminal F) being connected directly to the conductive plate 42, the electrode on the upper side (terminal R) being connected to the common electrode 58d (see FIG. 4) of the integrated chip 29. The common electrode 58d is connected to the chip incorporating the gate drive circuit 26 and the flip-flop circuit 27 via a wire.

FIG. 9 shows an arrangement wherein the conductive plate 42 carrying, as mounted thereon, the low-side power switching device 21, the chip capacitor 41 and the integrated chip 29 mounted as stacked on the chip capacitor 41 is mounted as stacked on the source electrode 25s of the high-side power switching device 25. The arrangement made it possible to further reduce the capacity of the module, hence, achieve further downsizing. With this arrangement, there is no need to interconnect the conductive plate 42 comprising a metal plate for example and the source electrode 25s of the high-side power switching device 25 by means of a wire, thus resulting in the module having a further simplified structure.

The low-side gate drive circuit 10, the low-side power supply 11 and the resistor 22 are further connected to each of the arrangements shown in FIGS. 7 to 9 to form the module. With either of the circuit configurations shown in FIGS. 1 and 2, the output line of the low-side gate drive circuit 10 supplied with voltage from the power supply 11 is connected to the gate electrode 21g of each power switching device 21 in any one of the arrangements shown in FIGS. 7 to 9. In the case of the circuit configuration shown in FIG. 1, one end of the resistor 22 is connected to the anode-side electrode (pad) 23s which is connected to the Schottky electrode 51 (see FIG. 4) of the diode 23 and formed on the obverse side of the integrated chip 29 with an interlayer insulator (not shown) intervening therebetween, while the other end of the resistor 22 connected to the power supply 11. In the case of the circuit configuration shown in FIG. 2, the resistor 22 is inserted between the anode-side electrode (pad) 23s of the diode 23 formed on the obverse side of each integrated chip 29 and the gate electrode 21g of the associated power switching device 21. In this case, the gate electrode 21g of the power switching device 21 and the electrode 23s of the diode may be interconnected via a thin wire L having a high resistance depicted by dotted line in FIG. 7. Further, though the source electrode 21s of each power switching device 21 is connected to the source electrodes of the respective resistor-incorporating level shift switches 28A and 28B via separate wires, it is possible that the source electrodes of the respective resistor-incorporating level shift switches 28A and 28B are formed into an integral source electrode which is connected to the source electrode 21s via one wire. Here, either of the circuit configurations shown in FIGS. 1 and 2 needs the gate drive circuit 10 for each of the plural phases. However, the circuit configuration of FIG. 1 need not necessarily be provided with the low-side power supply 11 and the resistor 22 for each phase, but may be provided with only one set of the low-side power supply 11 and the resistor 22 to be shared by all the phases (three phases in this embodiment). In the case of the circuit configuration shown in FIG. 2, the resistor 22 in addition to the gate drive circuit 10 is needed for each phase. However, the low-side power supply 11 need not necessarily be provided for each phase, but only one low-side power supply 11 may be shared by all the phases (three phases in this embodiment).

While each of the arrangements shown in FIGS. 7 to 9 uses the integrated chip 29 on which the three devices, or the resistor-incorporating level shift switches 28A and 28B and the bootstrap diode 23 are integrated together, these three devices may be formed on respective of independent and separate chips without integration. The circuit components formed using the wide bandgap semiconductor are favorable in heat conduction and hard to heat. In addition, these components operate normally even when heated to about 400° C. For this reason, such components can be mounted as stacked one upon another, which contributes to the downsizing of the module.

It was confirmed that the above-described inverter module having the integrated chip 29 and the power switching device chips 21 and 25 each formed using the wide bandgap semiconductor was able to attain such a high integration density as to reduce the size thereof to ⅕ or less as large as the size of a corresponding inverter module having an integrated chip 29 section and the power switching device chips 21 and 25 each formed using a Si semiconductor.

While the above-described embodiment uses a MOSFET formed using the wide bandgap semiconductor for each of the high-side and low-side power switching devices 21 and 25, use of an IGBT, MISFET, MESFET or the like formed using the wide bandgap semiconductor like the MOSFET can realize a similar module satisfying the space-saving and energy-saving requirements described above.

Even though each of the power switching devices 21 and 25 is formed using a Si semiconductor, the use of the aforementioned integrated chip 29 allows a smaller device to be realized than in cases where the integrated chip 29 section is formed using the Si semiconductor.

While the above-described embodiment is directed to the three-phase inverter device having three pairs of high-side and low-side power switching devices, the present invention can be similarly applied to an inverter device comprising a single-phase half bridge circuit having one such pair or a single-phase full bridge circuit having two such pairs.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

INDUSTRIAL APPLICABILITY

The semiconductor device and the module according to the present invention are compactly packaged power devices which are capable of operating at high speeds with a low loss and a high efficiency, which are applicable to small-sized inverters for example, and which are useful in a next-generation power electronics system or a like system that realizes space and energy saving.

The invention claimed is:

1. A module for use in an inverter device including at least one combination of:

an inverter main circuit section having: a high-side power switching device which has a high potential side electrode connected to a high potential side power supply line and which is ON/OFF-controllable according to a high-side gate drive signal; a low-side power switching device which has a low potential side electrode connected to a low potential side power supply line and which is ON/OFF-controllable according to a low-side gate drive signal; and an output terminal connected to a low potential side electrode of said high-side power switching device and a high potential side electrode of said low-side power switching device, said high-side power switching device and said low-side power switching device being connected in series between the high potential side power supply line and the low potential side power supply line which are to be applied with d.c. voltage;

a low-side gate drive circuit to be supplied with a source voltage from a low-side gate drive power supply to generate and output a gate drive signal for said low-side power switching device according to a low-side control signal for ON/OFF-controlling said low-side power switching device;

a capacitor having a one-side electrode electrically connected to said output terminal;

a diode having a cathode-side electrode connected to an other-side electrode of said capacitor and an anode-side electrode into which a current from said low-side gate drive power supply flows when said low-side power switching device is turned ON;

a first level shift switch which includes first and second electrodes, a control electrode and a signal output electrode, said first electrode being electrically connected to said low potential side power supply line, said second electrode being electrically connected to said other-side electrode of said capacitor, and which is configured to perform an operation such that when a first pulse is inputted to said control electrode at start of a period during which said high-side power switching device is to be kept ON, a second pulse having a potential that depends upon a potential of the other-side electrode of said capacitor and is higher than a potential of said first pulse is outputted from said signal output electrode;

a second level shift switch which includes first and second electrodes, a control electrode and a signal output electrode, said first electrode being electrically connected to said low potential side power supply line, said second electrode being electrically connected to said other-side electrode of said capacitor, and which is configured to perform an operation such that when a third pulse is inputted to said control electrode at end of said period during which said high-side power switching device is to be kept ON, a fourth pulse having a potential that depends upon a potential of said other-side electrode of said capacitor and is higher than a potential of said third pulse is outputted from said signal output electrode;

a signal generating circuit to be supplied with a voltage across the opposite ends of said capacitor as a source voltage and configured to generate and output a high-side control signal for turning ON said high-side power switching device in a manner timed to the output of said second pulse from said signal output electrode of said first level shift switch and turning OFF said high-side power switching device in a manner timed to the output of said fourth pulse from said signal output electrode of said second level shift switch; and a high-side gate drive circuit to be supplied with a voltage across the opposite ends of said capacitor as a source voltage and configured to generate and output a gate drive signal for said high-side power switching device according to said high-side control signal outputted from said signal generating circuit, the module comprising at least one combination of: a conductive substrate on which an integrated chip and said low-side power switching device are mounted, the conductive substrate being electrically connected to said output terminal and said one-side electrode of said capacitor; said high-side power switching device having said low potential side electrode electrically connected to said conductive substrate; said signal generating circuit electrically connected to said signal output electrode of each of said two level shift switches of said semiconductor device and electrically connected to said capacitor; and said high-side gate drive circuit electrically connected to each of said signal generating circuit and said high-side power switching device, said integrated chip comprising:

said first and second level shift switches each having said first and second electrodes, said control electrode, said signal output electrode, and a first semiconductor region forming a transistor device section which intervenes between said first electrode and said signal output electrode and is brought into or out of conduction according to a signal inputted to said control electrode and a resistor device section which intervenes between said signal output electrode and said second electrode, said first semiconductor region comprising a wide bandgap semiconductor; and said diode device having said cathode-side electrode, said anode-side electrode, and a second semiconductor region comprising a wide bandgap semiconductor.

2. The module according to claim 1, wherein: said first semiconductor region of each of said level shift switches has: a wide bandgap semiconductor substrate of a first conductivity type; a drift layer of the first conductivity type formed on said wide bandgap semiconductor substrate; a well region of a second conductivity type formed in a surface region of said drift layer exclusive of a part of the surface region; a source region of the first conductivity type formed in a predetermined region of a surface of said well region; and a RESURF region spaced apart from said source region and formed to extend over said well region and said part of the surface region of said drift layer, said RESURF region being of the first conductivity type or of a stacked structure comprising a first conductivity type semiconductor and an intrinsic semiconductor;

said first electrode is formed on said source region; said control electrode is formed over a portion of said well region lying intermediate said source region and said RESURF region with a gate insulator intervening therebetween; said signal output electrode is formed on said RESURF region; and said second electrode is formed on a reverse side of said wide bandgap semiconductor substrate; and said well region, said source region and said RESURF region form said transistor device section; and said RESURF region, said drift layer including said part of the surface region and said wide bandgap semiconductor substrate form said resistor device section.

3. The module according to claim 2, wherein a channel region comprising a wide bandgap semiconductor which is of the first conductivity type or of a stacked structure comprising a first conductivity type semiconductor and an intrinsic semiconductor is formed immediately under said gate insulator to interconnect said source region of the first conductivity type and said RESURF region of the first conductivity type or of said stacked structure comprising a first conductivity type semiconductor and an intrinsic semiconductor.

4. The module according to claim 1, wherein said second electrodes of respective of said two level shift switches and said cathode-side electrode of said diode are integrated into a common electrode.

5. The module according to claim 1, wherein said first semiconductor region of each of said two level shift switches and said second semiconductor region of said diode are formed of a same wide bandgap semiconductor substrate and a same wide bandgap semiconductor region formed thereon.

6. The module according to claim 5, wherein: said wide bandgap semiconductor substrate forming said first semiconductor region of each of said level shift switches is of a first conductivity type; said wide bandgap semiconductor region forming said first semiconductor region of each of the level shift switches has: a drift layer of the first conductivity type formed on said wide bandgap semiconductor substrate; a well region of a second conductivity type formed in a surface region of said drift layer exclusive of a part of the surface region; a source region of the first conductivity type formed in a predetermined region of a surface of said well region; and a RESURF region spaced apart from said source region and formed to extend over said well region and said part of the surface region of said drift layer, said RESURF region being of the first conductivity type or of a stacked structure comprising a first conductivity type semiconductor and an intrinsic semiconductor;

said first electrode is formed on said source region; said control electrode is formed over a portion of said well region lying intermediate said source region and said RESURF region with a gate insulator intervening therebetween; said signal output electrode is formed on said RESURF region; and said second electrode is formed on a reverse side of said wide bandgap semiconductor substrate; and said well region, said source region and said RESURF region form said transistor device section; and said RESURF region, said drift layer including said part of the surface region and said wide bandgap semiconductor substrate form said resistor device section.

7. The module according to claim 6, wherein a channel region comprising a wide bandgap semiconductor which is of the first conductivity type or of a stacked structure comprising a first conductivity type semiconductor and an intrinsic semiconductor is formed immediately under said gate insulator to interconnect said source region of the first conductivity type and said RESURF region of the first conductivity type or of said stacked structure comprising a first conductivity type semiconductor and an intrinsic semiconductor.

8. The module according to claim 5, wherein said second electrodes of respective of said two level shift switches and said cathode-side electrode of said diode are integrated into a common electrode located on a reverse side of said wide bandgap semiconductor substrate, while said first electrode and said signal output electrode of each of said two level shift switches and said anode-side electrode of said diode located on an obverse side of said wide bandgap semiconductor substrate.

9. The module according to claim 5, wherein said two level shift switches and said diode are each device-isolated by a mesa structure or a p-n junction on the obverse side of said wide bandgap semiconductor substrate.

10. The module according to claim 1, wherein said diode is a Schottky diode having a Schottky electrode as said anode-side electrode.

11. The module according to claim 1, wherein said wide bandgap semiconductor is silicon carbide.

12. The module according to claim 1, wherein said capacitor is a chip capacitor mounted on said conductive substrate and said semiconductor device is mounted as stacked on said capacitor.

13. The module according to claim 12, wherein said conductive substrate on which said low-side power switching device, said chip capacitor and said semiconductor device are mounted is mounted as stacked on said low potential side electrode of said high-side power switching device.

14. The module according to claim 1, wherein a chip comprising said signal generating circuit and said high-side gate drive circuit is mounted as stacked on said high-side power switching device.

* * * * *